United States Patent [19]

Pombo et al.

[11] Patent Number: 5,557,743
[45] Date of Patent: Sep. 17, 1996

[54] PROTECTION CIRCUIT FOR A MICROPROCESSOR

[75] Inventors: Raul Pombo, Plantation; Jaime Borras, Hialeah, both of Fla.; Michel Bron, Lausanne, Switzerland

[73] Assignee: Motorola, Inc., Schaumburg, Ill.

[21] Appl. No.: 223,484

[22] Filed: Apr. 5, 1994

[51] Int. Cl.⁶ .................................................. G06F 11/34
[52] U.S. Cl. ................ 395/186; 364/246.6; 364/DIG. 1; 395/402
[58] Field of Search .................................. 395/575, 425, 395/325, 775, 186, 402, 427; 364/232.8, 232.9; 388/902.5

[56] References Cited

U.S. PATENT DOCUMENTS

| | | |
|---|---|---|
| 4,211,919 | 7/1980 | Ugon . |
| 4,590,552 | 5/1986 | Guttag et al. ........................ 364/200 |
| 4,958,276 | 9/1990 | Kiuchi et al. ........................ 264/200 |
| 5,012,410 | 4/1991 | Ueda .................................... 364/200 |
| 5,014,191 | 5/1991 | Padgaonker et al. ............... 364/200 |
| 5,134,700 | 7/1992 | Eyer et al. ........................... 395/725 |
| 5,168,559 | 12/1992 | Tamura ................................ 395/425 |
| 5,210,841 | 5/1993 | Johnson .............................. 395/425 |
| 5,247,621 | 9/1993 | Gulick ................................. 395/325 |
| 5,278,962 | 1/1994 | Masuda et al. ..................... 395/400 |
| 5,305,460 | 4/1994 | Kaneko et al. ..................... 395/775 |
| 5,379,443 | 1/1995 | Margulis ............................. 395/425 |
| 5,404,547 | 4/1995 | Diamantstein et al. ............ 395/775 |

FOREIGN PATENT DOCUMENTS

| | | | |
|---|---|---|---|
| 56-94451 | 7/1981 | Japan | G06F 13/00 |
| 57-45636 | 3/1982 | Japan | G06F 3/14 |
| 63-41163 | 2/1988 | Japan | G06K 15/00 |
| 63-76095 | 4/1988 | Japan | G06K 19/00 |
| 163929 | 7/1988 | Japan | G06F 9/38 |
| 219149 | 8/1990 | Japan | G06F 12/16 |
| 135641 | 6/1991 | Japan | G06F 12/10 |
| 546473 | 2/1993 | Japan | G06F 12/06 |
| 612321 | 1/1994 | Japan | G06F 12/06 |

*Primary Examiner*—Hoa T. Nguyen
*Assistant Examiner*—Albert Decady
*Attorney, Agent, or Firm*—John G. Rauch; Barbara R. Doutre

[57] ABSTRACT

Electronic devices using microprocessors requiring additional external memory can have security protection for the microprocessors while in an expanded mode of operation. A microprocessor having a security access circuit allows executable code to be stored in a peripheral storage device, such as external EPROM, while maintaining protection to the microprocessor EEPROM by monitoring if an instruction code is generated from an internal memory source or an external memory source.

1 Claim, 4 Drawing Sheets

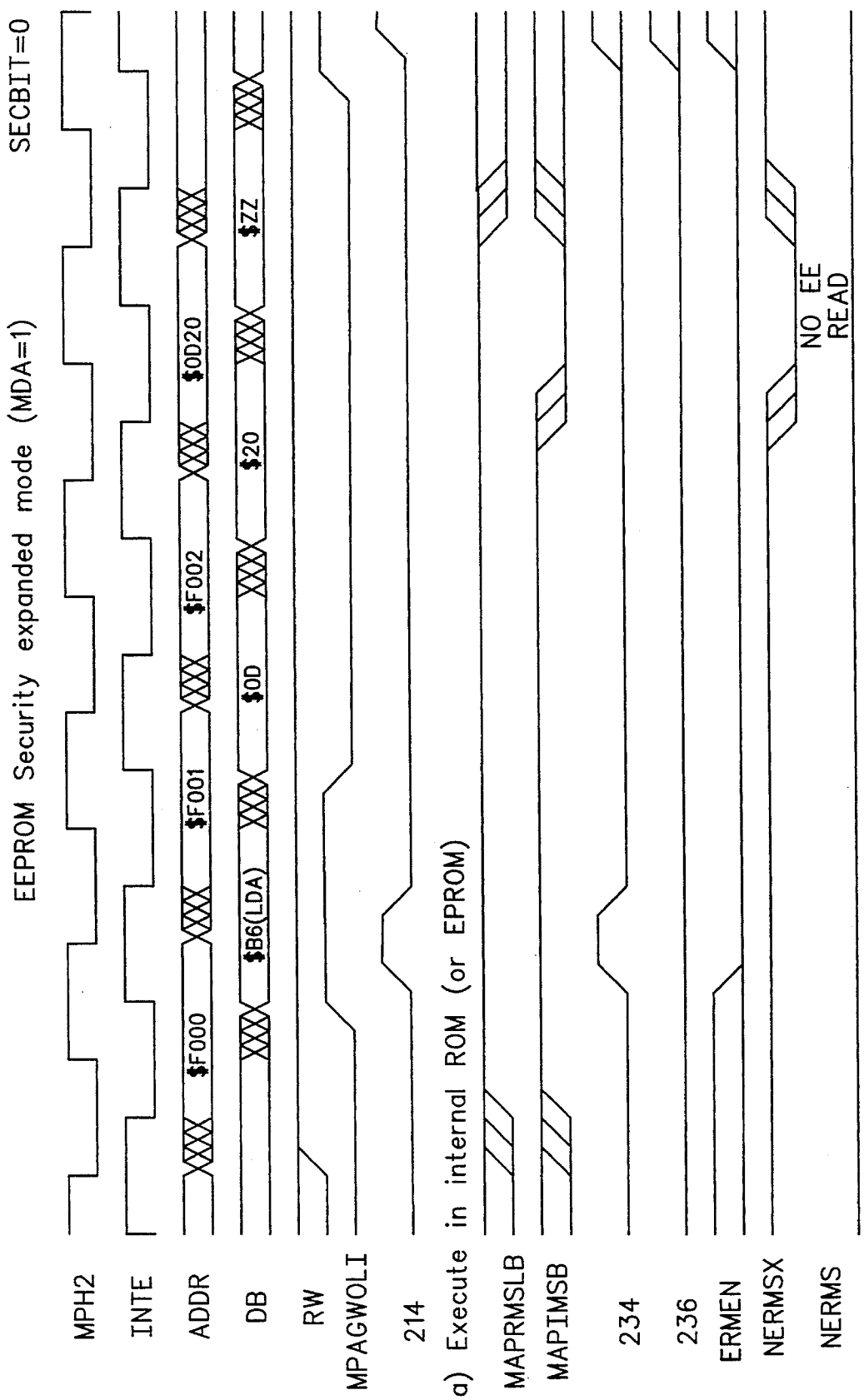

PROTECTION CIRCUIT FOR A MICROPROCESSOR

TECHNICAL FIELD

This invention relates to electronic circuits, and more specifically to microprocessor circuits.

BACKGROUND

Communication devices using microprocessors are continually requiring increases in their memory storage requirements. Expanding the internal memory in a microprocessor causes increases in die size and is very costly. In applications where additional memory is required, some microprocessors can be configured in an expanded mode for accessing external memory. In expanded mode, the microprocessor allows the software, running in the external memory, to read/write to an on-chip EEPROM (electrically erasable programmable read only memory). This can create a problem when security data, such as security algorithms and secret keys, is maintained in EEPROM and becomes accessible to the external world. At present, an intruder could replace the external memory with his own software in order to read the EEPROM thus obtaining the security algorithm and secret keys. The intruder could also attempt access to the internal EEPROM data using an internal RAM (random access memory) register to load and execute his own code. Presently microprocessors lock the address bus and data bus as a means for protection when operating in an internal mode, also known as single chip or non-expanded mode. When the internal mode is enabled, the microprocessor is protected because it operates using only the internal memory. While this technique provides software protection for on chip memory, microprocessor devices that are interfaced to external peripheral devices are left vulnerable to unauthorized access while operating in the expanded mode.

In expanded mode, all security for the microprocessor is lost because the EEPROM can still be read, making it undesirable to use external memory. More security problems could arise if an intruder were to try to download his own software code into internal RAM from the external memory in order to attempt access to the EEPROM. Techniques for protecting internal memory include instruction decoding to determine if the instruction is a read/write attempt to internal memory but this method uses decoding circuitry which can become complex. Another technique checks to see if an instruction falls within an address range to allow access to the internal memory, this method also uses an address decoder. Protection methods that rely on using security keys to validate an instruction from external memory use complex logic circuitry to protect the internal memory and present the danger of access from an intruder being able to break the security code and gain access to proprietary information in the internal memory.

Hence, there is a need for a microprocessor having external memory capability that provides protection to the internal memory while allowing executable code to be stored to the external memory device. A microprocessor that would not use up memory and time for decoding addresses and determining types of instructions would provide a more efficient means for protecting the internal memory.

BRIEF DESCRIPTION OF THE DRAWINGS

FIG. 4 Shows a second timing diagram for the security circuit of FIG. 2 operating in a secure mode.

DETAILED DESCRIPTION OF THE PREFERRED EMBODIMENT

Figure 1:
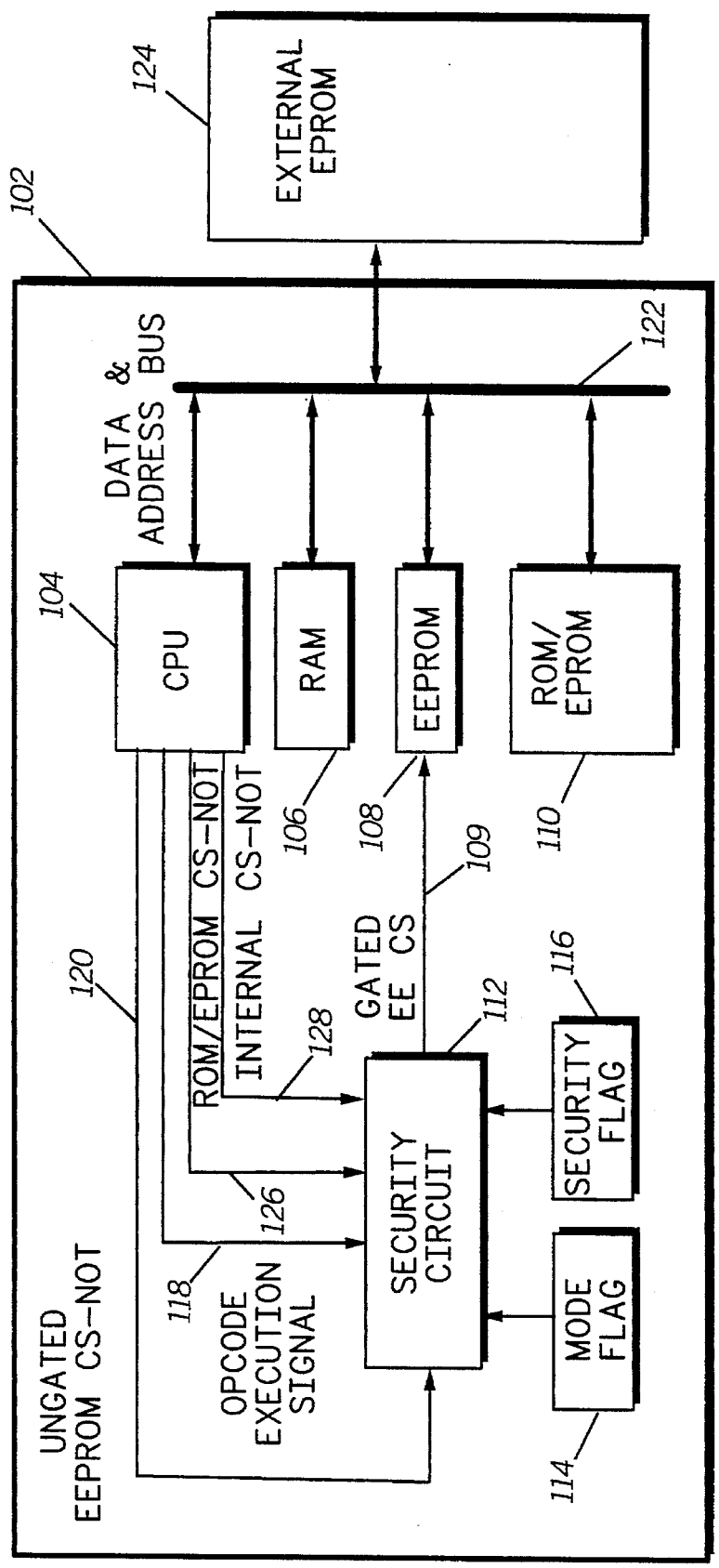
FIG. 1 shows a microprocessor and external memory device in accordance with the present invention.

A microprocessor having on chip memory but designed in a system where additional memory is required can be configured in an expanded mode to allow access to external memory devices. FIG. 1 of the accompanying drawings, shows a micro-computing system 100 that includes a microprocessor 102 and external memory source, external EPROM 124, in accordance with the present invention. Included in the microprocessor 102 are internal memory storage sources RAM 106, EEPROM 108, and ROM/EPROM 110 (read only memory or erasable programmable read only memory) all coupled to a central processing unit, CPU 104, via an address and data bus 122. The CPU 104 performs operations on data generated by the internal and external storage sources and generates a series of control signals that indicate the origin on an op-code instruction.

When operating in a non expanded mode the microprocessor 102 does not allow access to the external memory source 124. This invention allows microprocessor chips having on chip memory to provide read/write access protection to the EEPROM 108 while operating in the expanded mode, making the EEPROM invisible to external memory 124 and internal RAM 106 and allowing access only from the internal ROM/EPROM 110. The series of control signals generated by the CPU 104 are coupled to a security circuit 112, for controlling the status of the microprocessor 102. These control signals are coupled to input terminals in the security circuit 112 and include ungated EEPROM chip select CS-Not signal 120, op-code execution signal 118, ROM/EPROM CS-NOT signal 126 and internal CS-NOT signal 128. Also, coupled to the input terminals of security circuit 112 are mode flag 114 and security flag 116.

The mode flag 114 indicates whether the microprocessor 102 is operating in single or expanded mode operation and is preferably set externally through input pins to the microprocessor (not shown) or could also be set by bits programmed in software. If the mode flag 114 indicates that the microprocessor 102 is operating in expanded mode, then the expanded mode function will be provided, otherwise this function will be disabled. The security flag 116, coupled to the security circuit 112, is used to enable/disable the security function when operating in expanded mode and is set internally by the microprocessor based on a bit programmed in software. By setting the flag to disable security, the microprocessor 102 is set in a non secure state that allows access to the EEPROM 108 by any internal or external storage source, and by setting the flag to enable security, the microprocessor is set in a secure state where only access to the EEPROM 108 from ROM/EPROM 110 is allowed.

The op-code execution signal 118 is generated by the CPU 104 to indicate when an instruction is being fetched from memory and is coupled to the security circuit 112. The ROM/EPROM CS-NOT signal 126, generated by the CPU 104, indicates if the instruction is being fetched from the internal ROM/EPROM 110. The internal CS-NOT signal 128, generated by the CPU 104, indicates if the instruction is being fetched from an external source.

The security circuit 112 takes the ungated EEPROM CS-NOT signal 120, generated from the CPU 104, and gates it with the mode flag 114, the ROM/EPROM CS-NOT signal 126, the op-code execution signal 118, the internal CS-NOT signal 128, and the security flag 116. The security circuit 112 determines the origin of an op-code instruction and allows access or inhibits access to the internal EEPROM 108 based on the origin of the instruction.

If the microprocessor 102 is operating in expanded mode (as indicated by mode flag 114) and security is enabled by the security flag 116, read/write access to the EEPROM 108 will only be allowed if the op-code instruction is executed from the internal ROM/EPROM 110. The ungated EEPROM CS-NOT signal 120, generated by the CPU 104 to indicate if an instruction fetch to the EEPROM 108 should occur, will be coupled through the security means 112 and output as gated EEPROM (EE) CS signal 109. Access to the EEPROM 108 by any other memory sources, such as external EPROM 124 or internal RAM 106, will be disallowed by the security circuit 112 in this mode of operation. The external memory 124 can still access and execute code to RAM 106 and ROM/EPROM 110 as long as no access to EEPROM 108 is attempted.

The microprocessor 102 will maintain, in addition to the security circuit 112, the address bus to the external memory frozen (locked state) and the data bus floating (open gate state) when copy internal memory source is selected. This prevents an intruder from monitoring the address and data bus 122 when information is being fetched from the EEPROM 108 and helps keep the contents of the EEPROM secure.

Figure 2:
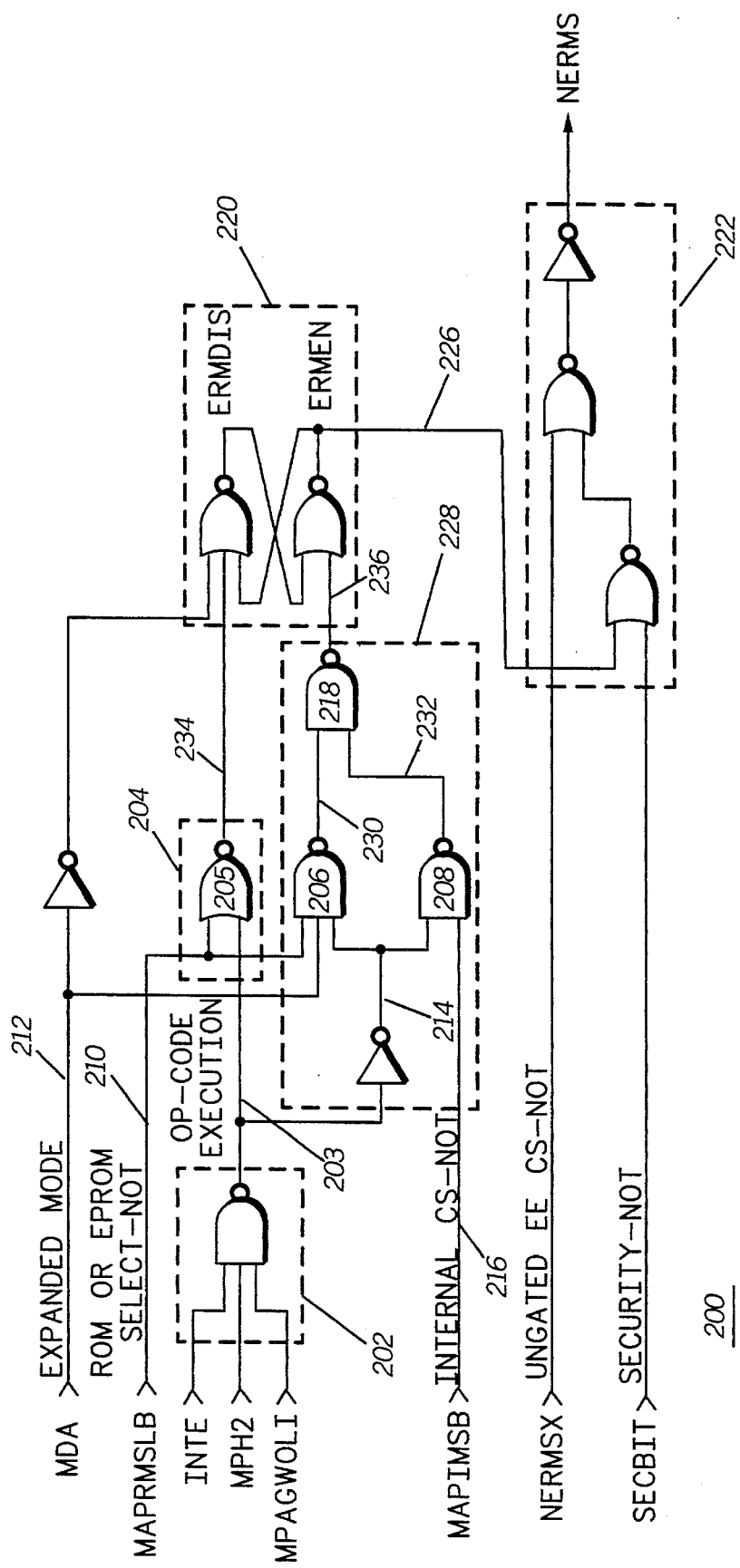
FIG. 2 shows a logic diagram of the preferred embodiment of a security circuit in accordance with the present invention.
Figure 3:
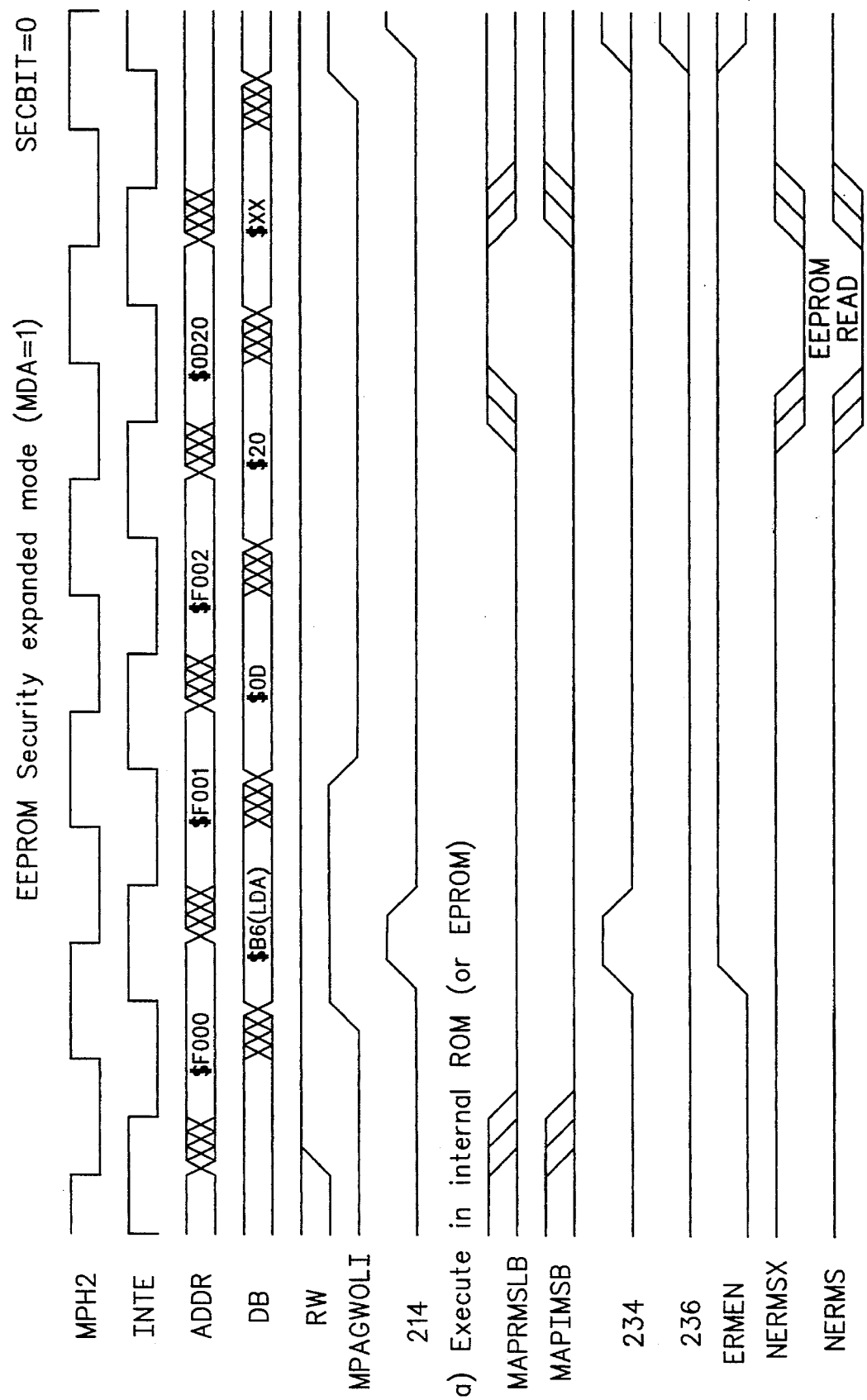
FIG. 3 shows a first timing diagram for the security circuit of FIG. 2 in a secure mode.

A logic diagram of the security circuit 112, as described by the present invention, is shown in FIG. 2 along with two timing diagrams shown in FIGS. 3 and 4. The timing diagram of FIGS. 3 and 4 feature the logic levels for the microprocessor in an expanded secure mode. In FIG. 3, the op-code instruction is shown fetched from the ROM/EPROM 110 and therefore, access to the EEPROM 108 is allowed. In FIG. 4, the op-code instruction is shown fetched from external memory 124 therefore access to the EEPROM 108 is not allowed. Table 1 gives a breakdown and description of the signal names and address locations used in the preferred embodiment for the microprocessor 102 along with security access circuit 112 in accordance with the present invention.

The CPU 104 recognizes where the next instruction will occur based on the previous instruction and therefore does not need to verify each byte of code to determine if it is an op-code instruction. This data processing method allows optimization of the security circuit 112 as the circuit does not have to process undesired code, i.e. there is no screening of data between instructions. Also, the instruction itself is not decoded, just the origin of the address for the instruction is looked at. The internal memory is enabled or disabled based on the location of the instruction in memory.

TABLE 1

| ADDR | DATA | COMMENT |
| --- | --- | --- |
| $F000 | $B6 | LDA extended op-code |
| $F001 | $0D | High byte of EEPROM address to be read |
| $F002 | $20 | Low byte of EEPROM address to be read |
| $0D20 | $XX | Read EEPROM data of address $0D20 |
| The signal description: | | |
| MPH2 | | internal clock |
| INTE | | internal E-clock |

TABLE 1-continued

| ADDR | DATA | COMMENT |
| --- | --- | --- |
| $F000 | $B6 | LDA extended op-code |
| $F001 | $0D | High byte of EEPROM address to be read |
| $F002 | $20 | Low byte of EEPROM address to be read |
| $0D20 | $XX | Read EEPROM data of address $0D20 |
| MPAGWOLI | | load new instruction op-code |
| MDA | | latched expanded mode state |
| SECBIT | | CONFIG bit, no security when set |
| MAPIMSB | | internal memory map select-not (cycle by cycle address decode) |
| MAPRMSLB | | internal ROM select-not (cycle by cycle address decode) |
| ADDR | | address bus |
| DB | | data bus |
| RW | | read/write signal |
| ERMEN | | EEPROM enable latch during instruction fetch and remaining latched from one instruction to another. |
| ERMDIS | | EEPROM disable |
| NERMSX | | ungated internal EEPROM select-not |
| NERMS | | gated internal EEPROM select-not |
| 214 | | inverted op-code execution |
| 234 | | executing in internal ROM/EPROM signal, sets ERM enable latch |
| 230 | | executing in internal resources other than ROM/EPROM |
| 232 | | executing in external resources |
| 236 | | (230*232)NOT, 236 must be 0 to allow access, clears ERM enable latch |

The circuit in FIG. 2 is configured with logic gates comprising five main sections. The first section 202 generates an op-code execution signal 203, the second section 204 determines if a fetch instruction was executed in internal ROM/EPROM, the third section 228 determines if the fetch instruction was generated from an external source or an internal source other than ROM/EPROM. The fourth section comprises a latch section 220 for latching from one fetch instruction to the next and providing an output to the fifth section, logic section 222. Logic section 222 generates a gated EEPROM chip select signal at the NERMS bit when the instruction originates from internal ROM/EPROM. The NERMS bit will allow or disallow access to the EEPROM.

Referring now to FIGS. 2 and 3, the MDA signal sets the circuit in the expanded mode with expanded mode signal 212. Signals INTE, MPH2, and MPAGWOLI, generated by CPU 104, are combined at logic section 202 and preferably within CPU 104, to provide the op-code execution signal 203. Logic section 204 determines if the instruction fetch was generated in internal ROM/EPROM, while logic section 228 determines if the fetch instruction was executed from an external source at gate 208 or from an internal source other than internal ROM/EPROM at gate 206. Logic section 204 sets the latch 220 to indicate an instruction execution in ROM/EPROM and provides a logic signal to logic section 222 to allow access to the EEPROM from ROM/EPROM. Logic section 228 clears the latch to provide a logic signal to logic section 222 that disallows access to the EEPROM, thus providing security to the EEPROM.

In order to allow access to the EEPROM from an internal ROM/EPROM source, the following sequence takes place. Logic section 202 determines that an instruction in memory has taken place and generates a logic level low, signal 203, to logic sections 204 and 228. Logic section 204 couples the ROM/EPROM select-NOT signal 210 (low) with the op-code execution signal 203 (low) and sets the latch 220 with a logic level high.

In logic section 228 the op-code execution signal 203 is inverted to a logic level high as signal 214, and coupled to logic gates 206 and 208. Logic gate 206 couples the ROM/EPROM select-NOT signal 210 (low), the expanded mode signal 212 (high) and the inverted op-code execution signal 214 (high) to produce the output signal 230 (high).

Logic gate 208 couples the inverted op-code execution signal 214 (high) with the internal select-NOT signal 216 (low) to produce a logic level high as signal 232. Logic gate 218 then couples the outputs of gates 206 and 208 and produces a logic level low. The latch output signal 226 generates a logic level high and forwards it to logic section 222 where an ungated EE CS-NOT signal (low) and security-NOT signal (low) become coupled with the latch output signal 226 to produce a logic level low at the NERMS bit thus allowing access to the EEPROM.

Referring now to FIGS. 2 and 4, in order to prevent access to the EEPROM the following sequence takes place. Logic section 202 determines that an instruction in memory takes place and generates a logic level low for the op-code execution signal 203 and forwards it to logic sections 204 and 228. Logic section 204 couples the ROM/EPROM select-NOT signal (high) with the op-code execution signal (low) and determines that the instruction from memory was not generated by internal ROM/EPROM thus sending a logic level low to the latch 220.

In logic section 228 the op-code execution signal 203 is inverted and coupled to logic gates 206 and 208. Logic gate 206 couples the inverted op-code execution signal 214 (high), the expanded mode signal 212 (high), and ROM/EPROM select-NOT signal 210 (high) to produce a logic level low at the output. A logic level high would occur if the op-code had originated from an internal RAM source, but in this case the op-code is originating from external EPROM and therefore logic gate 206 outputs a logic level low as signal 230.

Logic gate 208 which couples the internal select-NOT signal 216 (high) with the inverted op-code signal 214 (high) generates a logic level low as signal 232. The outputs of logic gates 206 and 208 are coupled at logic gate 218 to generate a logic level high for signal 236. The latch 220 sets the ERMEN bit 226 to a logic level low. The ERMEN bit 226 (low) gets coupled in logic section 222 with the ungated EEPROM CS-NOT (low) and security-NOT signal (low) to produce a logic level high at the NERMS bit to prevent access to the EEPROM.

The MDA bit was set to a logic level high in both examples to indicate an expanded mode of operation.

The security circuit 112 as described by the invention, provides protection for the microprocessor by preventing access to the internal EEPROM 108 while in the expanded mode, thus preventing intruders from gaining access to the security algorithm or secret keys. Furthermore, by making the EEPROM 108 inaccessible from internal RAM 106, intruders trying to load their own code into internal RAM would be prevented from gaining access to EEPROM data, because the EEPROM is inaccessible to anything except internal ROM/EPROM 110.

The security means 112 uses the op-code execution signal 118, the ROM/EPROM CS-NOT signal 126, and the internal CS-NOT signal 128 to set the security circuit latch 220 open or closed prior to executing the instruction. The ungated chip select will either be blocked or passed through as gated EE CS signal 109 by the security means 112. There is no need to decode any of the instructions as only the origin of the instruction is used to determine whether access to the EEPROM 108 will be allowed or blocked.

Furthermore, while in the expanded mode the microprocessor as described by the invention allows executable code to be processed from the external EPROM 124 to the internal RAM 106 and the internal ROM/EPROM 110 while protecting the internal EEPROM 108.

The security access circuit 112 as described by the present invention protects the internal program memory from unauthorized access, and the concepts of this invention are applicable to any processor with on chip memory.

What is claimed is:

1. A method for protecting an internal EEPROM of a microprocessor, the microprocessor having an address bus and a data bus configured for coupling an external memory to the microprocessor, the microprocessor acting upon an instruction originating from either internal memory, or external memory, the method comprising the steps of:

determining if the instruction originates from the external memory or the internal memory;

determining if the instruction originating from internal memory further originates from a read only memory;

allowing access to the internal EEPROM, freezing the address bus to the external memory and floating the data bus to the external memory when the instruction originates from an internal read only memory; and disallowing access to the EEPROM when the instruction originates from the external memory.

* * * * *